United States Patent
Cusack

(10) Patent No.: US 7,977,773 B1
(45) Date of Patent: Jul. 12, 2011

(54) LEADFRAME INCLUDING DIE PADDLE APERTURES FOR REDUCING DELAMINATION

(75) Inventor: Michael D. Cusack, Meridian, ID (US)

(73) Assignee: Marvell International Ltd., Hamilton (BM)

( * ) Notice: Subject to any disclaimer, the term of this patent is extended or adjusted under 35 U.S.C. 154(b) by 277 days.

(21) Appl. No.: 11/696,061

(22) Filed: Apr. 3, 2007

Related U.S. Application Data

(60) Provisional application No. 60/831,283, filed on Jul. 17, 2006.

(51) Int. Cl.
*H01L 23/495* (2006.01)

(52) U.S. Cl. ............... 257/666; 257/678; 257/E23.05; 257/E23.141

(58) Field of Classification Search ............... 257/692, 257/E23.031, 42, 43, 52, 66, 666–780, E23.05; 357/70

See application file for complete search history.

(56) References Cited

U.S. PATENT DOCUMENTS

| | | | | |
|---|---|---|---|---|
| 5,021,864 | A * | 6/1991 | Kelly et al. | 257/676 |
| 6,075,282 | A * | 6/2000 | Champagne | 257/675 |
| 6,870,254 | B1 * | 3/2005 | Estacio et al. | 257/692 |
| 2002/0149091 | A1 * | 10/2002 | Palmteer et al. | 257/667 |
| 2005/0199986 | A1 * | 9/2005 | Ma et al. | 257/670 |
| 2005/0242417 | A1 * | 11/2005 | Youn et al. | 257/676 |
| 2005/0255438 | A1 * | 11/2005 | Manos | 434/323 |

* cited by examiner

*Primary Examiner* — Matthew E Warren
*Assistant Examiner* — Fang-Xing Jiang

(57) ABSTRACT

Embodiments of the present invention provide leadframes including a die paddle including one or more apertures defined therein, and electronic packages employing the same and having a microelectronic device mounted on the die paddle over one or more of the apertures. Other embodiments may be described and claimed.

11 Claims, 4 Drawing Sheets

US 7,977,773 B1

LEADFRAME INCLUDING DIE PADDLE APERTURES FOR REDUCING DELAMINATION

CROSS REFERENCE TO RELATED APPLICATIONS

The present application claims priority to U.S. Provisional Patent Application No. 60/831,283, filed Jul. 17, 2006, entitled "DIE PADDLE HOLES FOR PROMOTING MOLD COMPOUND TO LEADFRAME ADHESION," the entire disclosure of which is hereby incorporated by reference in its entirety.

TECHNICAL FIELD

Embodiments of the present invention relate to the field of integrated circuits, and more particularly, to electronic packages and leadframes.

BACKGROUND

In the current state of integrated circuit technology, an integrated circuit device will often be in the form of a die. Such a die is typically mounted onto an underlying substrate such as, for example, a carrier substrate to form a "package." Some packages may include one or more dies coupled to a substrate such as, for example, a leadframe, which is frequently made of copper or copper alloy material. The leadframe may also include a die paddle to support the die. To form the package, an encapsulant material is generally used to encapsulate the die and the die paddle.

A package may experience reliability and/or functionality issues arising from a failure or defect in the package. One such failure is delamination. In general, delamination is the separation of the encapsulant material from one or more elements of the leadframe, or vice versa. Such delamination may lead to other problems such as undesirable accumulation of moisture, which may sometimes lead to cracking of the encapsulant material and/or further delamination due to expansion of the moisture during thermal processing. Although various reasons are thought to cause delamination (e.g., oxidization of the copper or the size of die paddle), no effective solution has been developed.

SUMMARY OF THE INVENTION

In various embodiments in accordance with the present invention, a leadframe is provided. In various ones of these embodiments, the leadframe may comprise a die paddle including one or more apertures defined in an area of the die paddle configured to support a microelectronic device.

In some embodiments, an electronic package may include a leadframe including a die paddle including one or more apertures defined therein. In various ones of these embodiments, the electronic package may further include a microelectronic device mounted on the die paddle over one or more of the apertures.

In various embodiments, the electronic package may comprise an encapsulant material adhered to one or more portions of the microelectronic device defined by the one or more apertures. In some embodiments, the encapsulant material may encapsulate at least a portion of the die paddle and at least a portion of the microelectronic device mounted thereon. In various embodiments, the encapsulant material comprises an epoxy material.

In various embodiments, the electronic package may be incorporated into a system. For example, in various embodiments, the system may comprise an electronic package including a leadframe including one or more apertures defined therein, and a microelectronic device mounted on the die paddle over one or more of the apertures.

In some embodiments, the system may further comprise a power supply to provide a voltage to the electronic package. In various ones of the embodiments, the system may further comprise a direct current to direct current (DC-DC) converter coupled to a power supply and an electronic package, the DC-DC converter configured to regulate a voltage provided to the electronic package.

In some embodiments, the system may comprise one of a group comprising a mobile phone, a laptop computer, a personal digital assistant, a gaming device, a music player, a video player, a printer, a set-top box, a desktop computing device, and an entertainment control unit.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

The terms chip, integrated circuit, monolithic device, semiconductor device, and microelectronic device are often used interchangeably in the microelectronics field. The present invention is applicable to all of the above as they are generally understood in the field.

Embodiments of the present invention are directed to leadframes including die paddle apertures for promoting adhesion between the leadframe and an encapsulant material, electronic packages endowed with leadframes including such die paddle apertures, and systems including such electronic packages.

Figure 1:
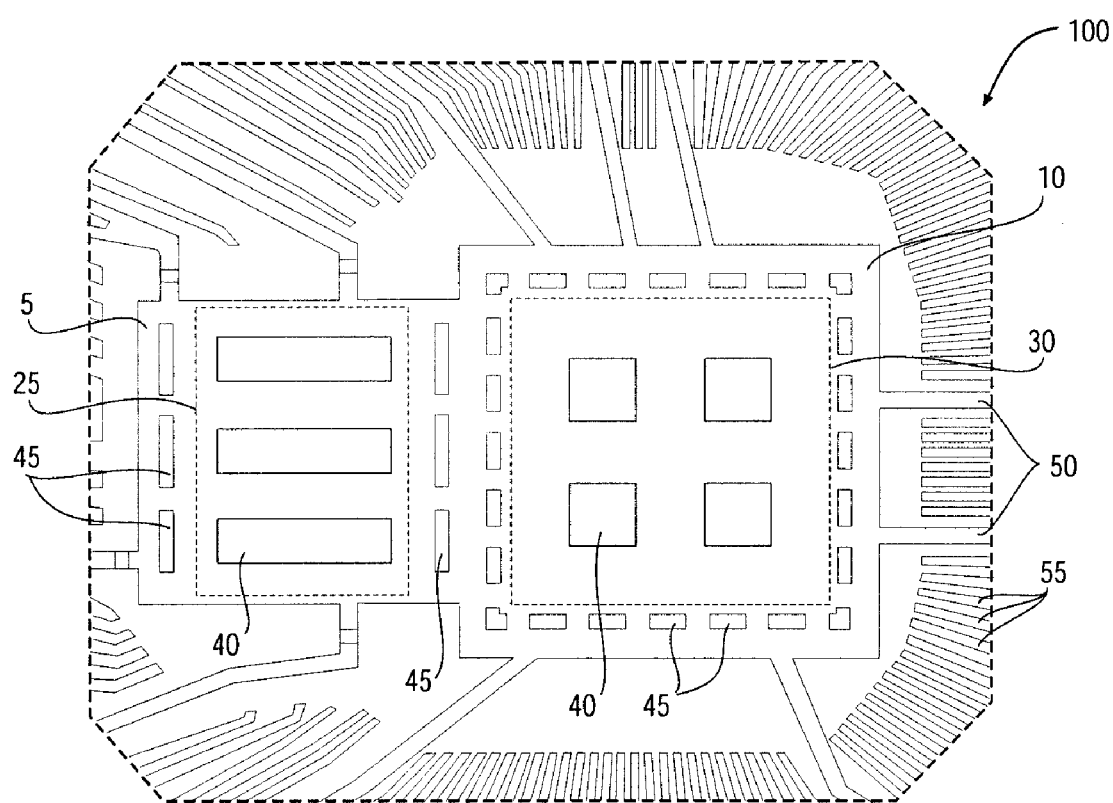
FIG. 1 illustrates a plan view of a leadframe in accordance with various embodiments of the present invention.
Figure 2:
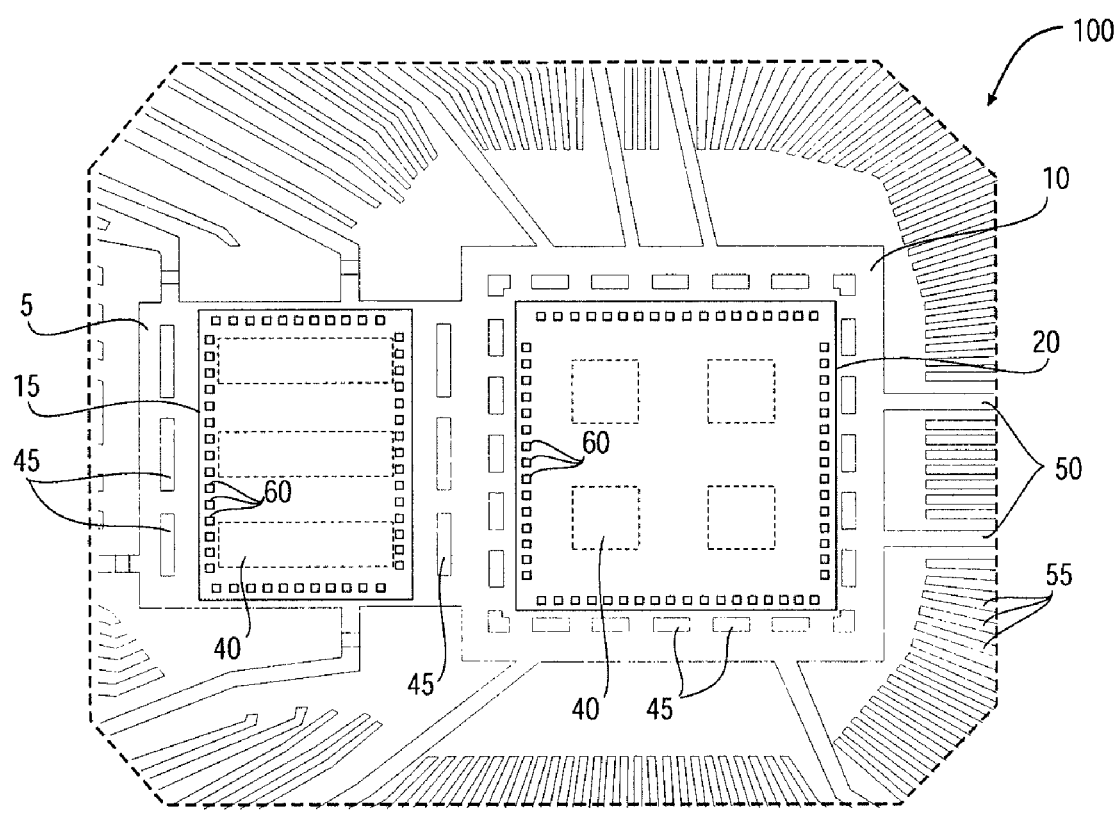
FIG. 2 illustrates another plan view of the leadframe of FIG. 1 in accordance with various embodiments of the present invention.
Figure 3:
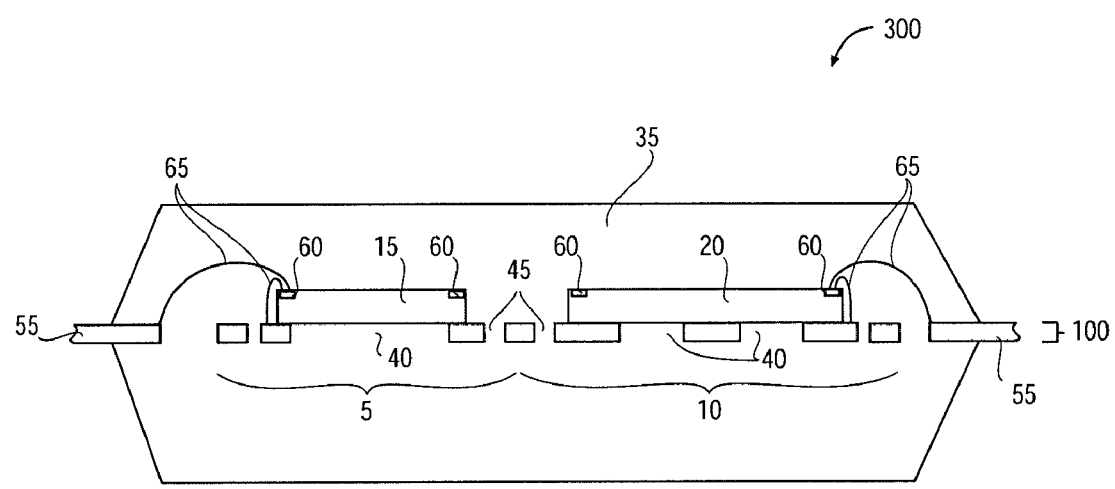
FIG. 3 illustrates a cross-sectional view of an electronic package incorporating the leadframe of FIG. 1 and FIG. 2 in accordance with various embodiments of the present invention.

An exemplary leadframe 100, in accordance with various embodiments of the present invention, is illustrated in FIG. 1 and FIG. 2. An exemplary electronic package 300 incorporating leadframe 100 of FIG. 1 and FIG. 2 is illustrated in FIG. 3. As illustrated, leadframe 100 includes die paddles 5, 10 each configured to support a microelectronic device 15, 20, respectively, in areas 25, 30 as illustrated in phantom in FIG. 1 and as illustrated in FIG. 2. The die paddles 5, 10 can represent different locations on a same, singular die paddle, as shown in FIG. 1 and FIG. 2. Leadframe 100 may be formed from any one or more of various materials, depending on the application. For example, leadframe 100 may comprise copper or a copper alloy. Although material(s) used to form leadframe 100 may be selected for various beneficial aspects (e.g., strength, conductivity, etc.), delamination between one or more of die paddles 5, 10 of leadframe 100 and an encapsulant material used for encapsulation (as illustrated at 35 of FIG. 3 to form electronic package 300) has been known to occur for certain types of materials including, for example, copper and copper alloys.

Embodiments of the present invention may minimize or even eliminate delamination between a die paddle and an encapsulant material. As illustrated in FIGS. 1-3, leadframe 100 includes die paddles 5, 10 each configured to support microelectronic device 15, 20, respectively, in areas 25, 30. In various ones of these embodiments, one or both of die paddles 5, 10 may include one or more apertures 40 disposed in areas 25, 30, whereon microelectronic devices 15, 20 may be mounted. The apertures 40 may allow for encapsulant material 35 (e.g., during an encapsulation operation) to come into contact with microelectronic devices 15, 20 disposed in one or more of areas 25, 30. The adhesion between encapsulant material 35 and microelectronic device 15, 20 may result in minimization or elimination of delamination between encapsulant material 35 and die paddles 5, 10.

Minimization or elimination of delamination between an encapsulant material and a die paddle may be due at least in part to a "locking" effect. Such locking may result if the bond between the encapsulant material and a microelectronic device mounted on the die paddle is a stronger bond than the bond between the encapsulant material and the die paddle. Thus, even if the encapsulant material and the die paddle were to lose adhesion (or were to never adhere at all) to each other, the bond between the encapsulant material and the microelectronic device may resist or prevent pulling away of the die paddle from the encapsulant material or vice versa. In other embodiments, the locking may be capable of preventing or at least resisting loss of adhesion in the first place, possibly due at least in part to maintenance of pressure on the die paddle due to the bond between the encapsulant material and the microelectronic device.

Although apertures 40 are depicted as being rectangular in shape for die paddle 5 and square in shape for die paddle 10, other configurations are possible. For example, in various embodiments, an aperture may be circular, triangular, or any other shape. Apertures may be arranged in any manner including the arrangements as illustrated in FIGS. 1-3, or may be in some other arrangement. For example, apertures may be arranged in a circular pattern, a cross pattern, or disposed under the corners of a microelectronic device. In some embodiments, a die paddle may include any number of apertures of any number of shapes.

Although the illustrated embodiments depict multiple apertures 40 for each die paddle 5, 10, in various embodiments, a die paddle may include a single aperture. In still other embodiments including more than one die paddle, one or more of the die paddles may include one or more apertures whereas another one or more die paddles may include no apertures.

In any event, the aperture(s) in a die paddle may be variously configured so as to provide the desired level of mechanical support for a microelectronic device supported thereby as well as to provide the desired level of resistance to delamination between the die paddle from encapsulant material. For example, if a die paddle included a number of apertures so that a relatively small surface area of die paddle were provided to a microelectronic device mounted thereon, an undesirable level of bowing of the die paddle and/or microelectronic device may result. On the other hand, if a die paddle included too few apertures so that a relatively large surface area of die paddle were provided to a microelectronic device mounted thereon, an undesirable level of delamination may result.

In various embodiments, one or both of die paddles 5, 10 may also include peripheral apertures 45 in areas that are not used for supporting a microelectronic device. As shown in FIG. 1 and FIG. 2, the peripheral apertures 45 are separate from the apertures 40, and the peripheral apertures 45 can be located along each side of the area of the die paddle configured to support a microelectronic device. Peripheral apertures 45 may be configured to inhibit movement of die paddles 5, 10 in electronic package 300. For example, if encapsulant material 35 is used (see FIG. 3), encapsulant material 35 may form contiguously through peripheral apertures 45 so that once hardened, encapsulant material 35 effectively "locks" one or both of die paddles 5, 10 in place. According to various embodiments, the encapsulant material 35 that is formed contiguously through the peripheral apertures 45 is disposed on opposing surfaces of the die paddle, as shown in FIG. 3. That is, the encapsulant material 35 adheres to a surface (e.g., a die-mounting surface) of the die paddles 5, 10 upon which the microelectronic devices 15, 20 are mounted and further adheres to another surface that is disposed opposite to the die-mounting surface. In various embodiments, a leadframe may include one or more peripheral apertures, variously disposed, and in any one or more of various shapes and sizes, depending on the application. In other embodiments, however, peripheral apertures may be excluded altogether.

A die paddle may be variously configured, depending on the application, and may include features generally known in the art. In general, a die paddle may be used for providing structural support for a microelectronic device mounted thereon, and sometimes, a die paddle may serve as a common potential source (e.g., ground or power-supply). In various embodiments and as illustrated in FIG. 1 and FIG. 2, one or both of die paddles 5, 10 may include support bars 50 (sometimes known in the art as tie bars). Support bars may provide support for the corresponding die paddle during, for example, an assembly process.

In various embodiments, a leadframe may include a single die paddle, or multiple die paddles, onto which one or more microelectronic devices may be mounted. Although the illustrated embodiment depicts two die paddles 5, 10 joined to form a unitary body, it is contemplated that die paddles 5, 10 could instead be distinct die paddles. Sometimes, it may be necessary or desirable to mount microelectronic devices onto separate die paddles as opposed to a single die paddle. It should be noted that although the illustrated embodiment depicts two microelectronic devices 15, 20, it is contemplated that any number of microelectronic devices in any configuration may be included in an electronic package in accordance with various embodiments. For example, microelectronic devices may be stacked and/or may be variously arranged on a leadframe and/or a die paddle. It should also be noted that a leadframe may include more than two die paddles. To be sure, the embodiments illustrated in FIGS. 1-3 (and other embodiments herein discussed) are intended to be exemplary in nature and thus not exhaustive of the embodiments within the scope of this disclosure.

As illustrated, leadframe 100 may include bond fingers 55 (sometimes known in the art as leads or lead fingers) disposed around the periphery of leadframe 100 for interconnection between one or more of microelectronic devices 15, 20 and the outside of electronic package 300 (e.g., if mounting electronic package 300 to a printed circuit board). The illustrated configuration sometimes is referred to in the art as a quad flat package. In other embodiments, however, bond fingers 55 may be disposed around less than the entire periphery of leadframe 100, depending on the specific application. For example, in various embodiments, bond fingers 55 may be disposed on two sides of leadframe 100.

For making the interconnections between one or more of microelectronic devices 15, 20 and the outside of electronic package 300 by way of bond fingers 55, microelectronic devices 15, 20 may include bond pads 60 to which interconnecting wires 65 (as illustrated in FIG. 3) may be bonded. In various embodiments, microelectronic devices 15, 20 may be wire bonded with one or more of die paddles 5, 10, depending on the application. For example, one or both of die paddles 5, 10 may serve as a common ground or power-supply and one or both of microelectronic devices 15, 20 may be electrically interconnected therewith according to some embodiments. Microelectronic devices 15, 20 may include bond pads 60 for any one or more of various interconnection purposes including, for example, inputting and/or outputting signals, providing a ground potential, and providing a power-supply potential.

Material selected for encapsulant material 35, as illustrated in FIG. 3, may be any type of encapsulant material known in the art suitable for the purpose. For example, encapsulant material 35 may be an epoxy material. In various other embodiments, however, encapsulant material 35 may be a selected one or more of a plastic material and a ceramic material. It is noted that "encapsulant" may sometimes be referred to in the art as "mold compound" or "molding material."

Figure 4:
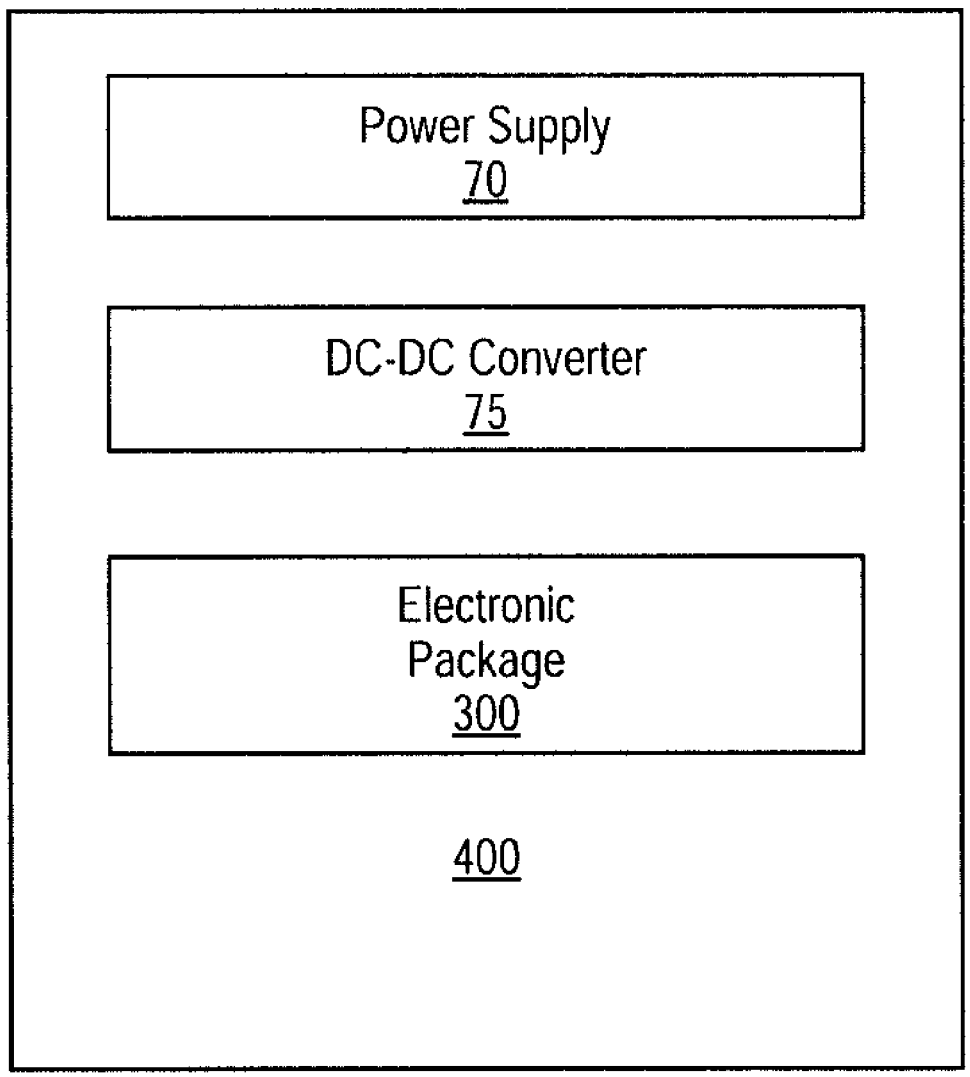
FIG. 4 illustrates a system in accordance with various embodiments of the present invention.

Various embodiments of the present invention may be employed for all types of systems that use electronic packages including leadframes. An exemplary embodiment of a system is illustrated in FIG. 4. As illustrated, system 400 may include power supply 70, direct-current to direct-current (DC-DC) converter 75, and electronic package 300 comprising a leadframe including a die paddle having one or more apertures and a microelectronic device mounted on the die paddle over the one or more apertures. In various embodiments, system 400 may represent general purpose and/or special purpose data processing systems, including personal computers, consumer electronic devices, and/or communications devices. For example, in exemplary embodiments, a leadframe in accordance with various embodiments may be used in portable electronic devices, such as, for example, mobile phones, laptop computers, personal digital assistants, gaming devices, music players, and video players. In various other exemplary embodiments, a leadframe may be used in stationary electronic devices, such as, for example, printers (e.g., digital printers), set-top boxes, desktop computing devices, and entertainment control units.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:
1. An electronic package comprising:
   a leadframe including
      a first die paddle, the first die paddle including
         a first aperture defined in an area configured to support a first microelectronic device, and
         a plurality of second apertures defined in an area not used to support the first microelectronic device, the plurality of second apertures being separate from the first aperture and at least one of the second apertures being located along each side of the area configured to support the first microelectronic device, and
      a second die paddle, the second die paddle including
         a third aperture defined in an area configured to support a second microelectronic device, and
         a plurality of fourth apertures, the plurality of fourth apertures being (i) separate from the first aperture, the plurality of second apertures, and the third aperture, and (ii) located along at least two sides of a second microelectronic device; and
   the first microelectronic device, the first microelectronic device being mounted on a first surface of the first die paddle over the area configured to support the first microelectronic device;
   the second microelectronic device, the second microelectronic device being mounted on the second die paddle over the third aperture;
   an encapsulant material encapsulating at least the first microelectronic device and the first die paddle;
   wherein a first portion of the encapsulant material forms contiguously through each of the plurality of second apertures, the first portion of the encapsulant material being disposed on a second surface of the first die paddle, the second surface being disposed opposite to the first surface, and wherein a second portion of the encapsulant material is adhered to a portion of the first microelectronic device through the first aperture to form a bond between the second portion of the encapsulation material and the portion of the first microelectronic device.

2. The electronic package of claim 1, wherein the encapsulant material comprises an epoxy material.

3. The electronic package of claim 1, wherein the electronic package is a quad flat package.

4. The electronic package of claim 1, wherein the leadframe comprises a material including copper.

5. The electronic package of claim 4, wherein the leadframe includes a copper alloy.

6. The electronic package of claim 1, wherein the first die paddle and the second die paddle form a unitary body.

7. The electronic package of claim 1, wherein at least two of the second apertures are located along each side of the area configured to support the first microelectronic device.

8. A system comprising:
an electronic package including
a leadframe including
a first die paddle, the first die paddle including
a first aperture defined in an area configured to support a first microelectronic device, and
a plurality of second apertures defined in an area not used to support the first microelectronic device, the plurality of second apertures being separate from the first aperture and at least one of the second apertures being located along each side of the area configured to support the first microelectronic device, and
a second die paddle, the second die paddle including
a third aperture defined in an area configured to support a second microelectronic device, and
a plurality of fourth apertures, the plurality of fourth apertures being (i) separate from the first aperture, the plurality of second apertures, and the third aperture, and (ii) located along at least two sides of a second microelectronic device; and
the first microelectronic device, the first microelectronic device being mounted on a first surface of the first die paddle over the area configured to support the first microelectronic device;
the second microelectronic device, the second microelectronic device being mounted on the second die paddle over the third aperture;
an encapsulant material encapsulating at least the first microelectronic device and the first die paddle;
wherein a first portion of the encapsulant material forms contiguously through each of the plurality of second apertures, the first portion of the encapsulant material being disposed on a second surface of the first die paddle, the second surface being disposed opposite to the first surface, and
wherein a second portion of the encapsulant material is adhered to a portion of the first microelectronic device through the first aperture to form a bond between the second portion of the encapsulation material and the portion of the first microelectronic device;
a power supply to provide a voltage to the electronic package; and
a direct current to direct current (DC-DC) converter coupled with the power supply and the electronic package, the DC-DC converter configured to regulate the voltage provided to the electronic package.

9. The system of claim 8, wherein the electronic package is a quad flat package.

10. The electronic package of claim 8, wherein the encapsulant material comprises an epoxy material.

11. The system of claim 8, wherein the system comprises one of a mobile phone, a laptop computer, a personal digital assistant, a gaming device, a music player, a video player, a printer, a set-top box, a desktop computing device, or an entertainment control unit.

* * * * *